(12) United States Patent
Lee et al.

(10) Patent No.: US 10,943,924 B2
(45) Date of Patent: Mar. 9, 2021

(54) SEMICONDUCTOR-ON-INSULATOR FINFET DEVICES WITH HIGH THERMAL CONDUCTIVITY DIELECTRICS

(71) Applicant: INTERNATIONAL BUSINESS MACHINES CORPORATION, Armonk, NY (US)

(72) Inventors: Choonghyun Lee, Rensselaer, NY (US); Sanghoon Shin, Mohegan Lake, NY (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/956,209

(22) Filed: Apr. 18, 2018

(65) Prior Publication Data

US 2019/0326324 A1 Oct. 24, 2019

(51) Int. Cl.
| | | |
|---|---|---|
| H01L 27/12 | (2006.01) | |
| H01L 23/473 | (2006.01) | |
| H01L 21/762 | (2006.01) | |
| H01L 27/088 | (2006.01) | |
| H01L 29/06 | (2006.01) | |
| H01L 29/10 | (2006.01) | |

(52) U.S. Cl.
CPC ...... *H01L 27/1203* (2013.01); *H01L 21/7624* (2013.01); *H01L 23/473* (2013.01); *H01L 27/088* (2013.01); *H01L 29/0649* (2013.01); *H01L 29/1033* (2013.01); *H01L 29/1087* (2013.01)

(58) Field of Classification Search
None
See application file for complete search history.

(56) References Cited

U.S. PATENT DOCUMENTS

| | | |
|---|---|---|
| 6,242,778 B1 | 6/2001 | Marmillion et al. |
| 9,029,949 B2 | 5/2015 | Gambino et al. |
| (Continued) | | |

FOREIGN PATENT DOCUMENTS

| | | |
|---|---|---|
| CN | 101916773 B | 5/2012 |
| CN | 105552126 A | 5/2016 |

OTHER PUBLICATIONS

Bresser et al. "Integration of buried insulators with high thermal conductivity in SOI MOSFETs: Thermal properties and short channel effects", Sep. 12, 2005, Elsevier, Solid State Electronics 49, pp. 1522-1528. (Year: 2005).*

(Continued)

*Primary Examiner* — Telly D Green
(74) *Attorney, Agent, or Firm* — Tutunjian & Bitetto, P.C.; Erik Johnson

(57) ABSTRACT

In accordance with embodiments of the present invention, a semiconductor device and method for forming a semiconductor device is described. The semiconductor device includes a substrate, including a buried dielectric layer between a base substrate and semiconductor layer. A fin is formed in the semiconductor substrate and having source and drain regions formed adjacent to each side of a gate structure. A heat conducting dielectric encapsulating a lower portion of the fin and source and drain regions above the buried dielectric layer to transfer heat away from the gate structure.

16 Claims, 13 Drawing Sheets

(56) References Cited

U.S. PATENT DOCUMENTS

| | | | |
|---|---|---|---|
| 9,209,202 B2 | 12/2015 | Ponoth et al. | |
| 9,412,664 B2* | 8/2016 | Leobandung | H01L 21/823431 |
| 9,634,084 B1* | 4/2017 | Sheraw | H01L 21/324 |
| 9,640,536 B2* | 5/2017 | Leobandung | H01L 21/823431 |
| 9,705,001 B2* | 7/2017 | Yamazaki | H01L 29/7869 |
| 10,297,668 B1* | 5/2019 | Lee | H01L 29/66666 |
| 2009/0014795 A1* | 1/2009 | Koh | H01L 29/66795 |
| | | | 257/347 |
| 2011/0127608 A1* | 6/2011 | Cheng | H01L 21/76251 |
| | | | 257/347 |
| 2014/0239420 A1* | 8/2014 | Basker | H01L 29/66803 |
| | | | 257/412 |
| 2015/0228762 A1* | 8/2015 | He | H01L 29/66795 |
| | | | 257/410 |
| 2015/0263045 A1* | 9/2015 | Leobandung | H01L 21/823431 |
| | | | 257/351 |
| 2015/0294913 A1* | 10/2015 | Leobandung | H01L 21/823431 |
| | | | 438/275 |
| 2016/0190303 A1* | 6/2016 | Liu | H01L 29/66795 |
| | | | 257/192 |
| 2016/0293737 A1* | 10/2016 | Liu | H01L 29/66545 |
| 2016/0329332 A1* | 11/2016 | Leobandung | H01L 21/823431 |
| 2017/0012194 A1 | 1/2017 | Wang et al. | |
| 2017/0062714 A1* | 3/2017 | Kau | H01L 23/3735 |
| 2017/0084512 A1 | 3/2017 | Kundu et al. | |
| 2017/0125539 A1* | 5/2017 | Cheng | H01L 29/41791 |
| 2017/0323942 A1 | 11/2017 | Voldman | |
| 2018/0061846 A1 | 3/2018 | Gan | |
| 2019/0229200 A1* | 7/2019 | Lee | H01L 21/28079 |

OTHER PUBLICATIONS

Scholten, "Experimental Assessment of Self-Heating in SOI FinFETs", Proceedings of the 2009 International Electron Device Meeting, Dec. 2009, pp. 305-308.

Shin, "Origin and Implications of Hot Carrier Degradation of Gate-all-around Nanowire III-V MOSFETs", IEEE International Reliability Physics Symposium, Jun. 2014, pp. 1-6.

* cited by examiner

US 10,943,924 B2

SEMICONDUCTOR-ON-INSULATOR FINFET DEVICES WITH HIGH THERMAL CONDUCTIVITY DIELECTRICS

BACKGROUND

Technical Field

The present invention generally relates to fin field effect transistor (finFET) device, and more particularly to reducing self-heating of finFET devices in operation.

Description of the Related Art fin field effect transistors (finFETs), and particular semiconductor-on-insulator (SOI) finFETs benefit from simplified process flows with good well formation and no punch through stops (PTS). Additionally, SOI finFETs may have high gate controllability. However, SOI finFETs may suffer from drawbacks including heat build-up in the transistor. As a current is applied to the transistor, internal resistance may cause heat to build up, thus raising the temperature of the finFET and the device on which the finFET is formed.

Without adequate dissipation, the temperature of the transistor may rise to such an extent that the performance of the transistor is negatively affected. Possible negative effects of the temperature rise may include decreases to carrier mobility, current and threshold voltage, as well as increases to leakage current and subthreshold slope. Additionally, high temperatures in a transistor can often lead to degradation of the transistor, resulting in a reduced transistor lifetime and increased variability. These effects may manifest in a finFET as higher delay and higher error rates.

SUMMARY

In accordance with an embodiment of the present invention, a semiconductor device is described. The semiconductor device includes a substrate, including a buried dielectric layer between a base substrate and semiconductor layer. A fin is formed in the semiconductor substrate and having source and drain regions formed adjacent to each side of a gate structure. A heat conducting dielectric encapsulating a lower portion of the fin and source and drain regions above the buried dielectric layer to transfer heat away from the gate structure.

In accordance with an embodiment of the present invention, a semiconductor device is described. The semiconductor device includes a semiconductor-on-insulator substrate including a buried dielectric, the buried dielectric being composed of a dielectric layer and a heat conducting layer. A fin is formed on the heat conducting layer from a semiconductor layer of the semiconductor-on-insulator substrate. A gate structure is formed over and around the fin in a transverse direction relative to the fin, the gate structure including spacers on each side of the gate structure, with source and drain regions epitaxially grown around the fin with a diamond shape adjacent to outer surfaces of the spacers. A heat conducting dielectric encapsulating a lower portion of the source and drain regions above the substrate to transfer heat away from the gate structure.

In accordance with an embodiment of the present invention, a method for forming semiconductor device is described. The method includes forming a substrate, including a buried dielectric layer between a base substrate and semiconductor layer using a transfer process. Further included is forming a fin in the semiconductor layer and growing source and drain regions on the fin adjacent to each side of a gate structure. The method further includes forming a heat conducting dielectric encapsulating a lower portion of the fin and source and drain regions above the buried dielectric layer to transfer heat away from the gate structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
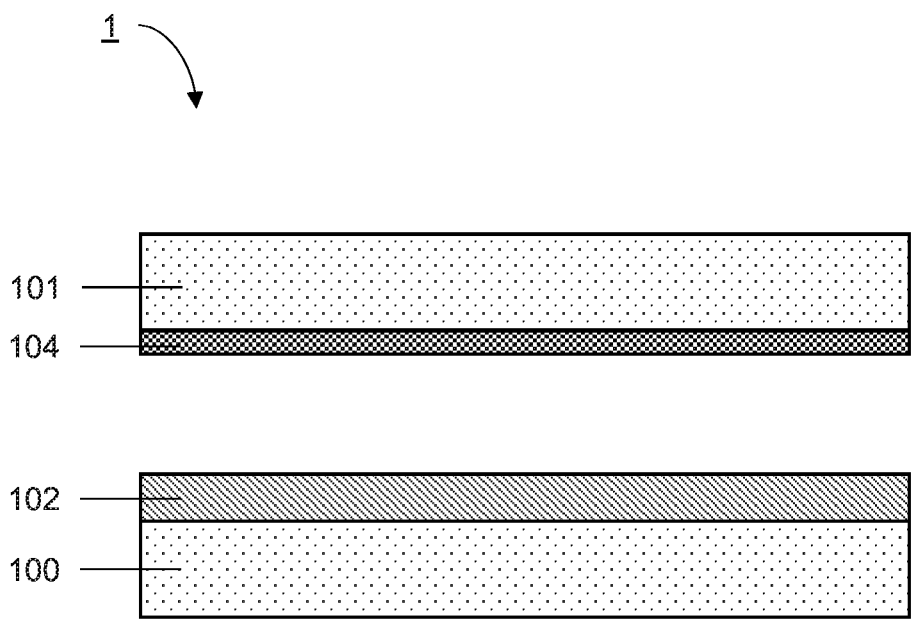
FIG. 1 is a cross-sectional view showing a semiconductor-on-insulator (SOI) substrate and a transfer substrate for a semiconductor device, in accordance with an embodiment of the present invention.

Aspects of the present invention relate to finFET devices, such as, e.g., finFETs with SOI substrates. The finFETs according to aspects of the invention are isolated with dielectrics to form separate transistors on an SOI. A layer of dielectric having a high thermal conductivity, such as, e.g., aluminum oxide ($Al_2O_3$), silicon nitride (SiN), yttrium oxide ($Y_2O_3$), among others, may assist to reduce self-heating of a finFET while in operation.

The high thermal conductivity dielectric layer may be formed in between fins and gates and the SOI substrate. The high thermal conductivity dielectric layer may also be formed to wrap around contact structures such as the source/drain regions formed over the fins of the finFETs. The high thermal conductivity dielectric may either replace a buried oxide layer of an SOI substrate, or be formed on top of the buried oxide layer. The finFET device may, therefore, benefit from improved heat dissipation away from the channel region of the finFET and into the substrate. Thus, transistor performance may be improved, transistor lifetime may be extended due to less degradation from heat, and delay and error in the transistor may be reduced.

Exemplary applications or uses to which the present invention can be applied include, but are not limited to, e.g.: finFET devices such as processors, memory and storage devices, and other transistor device.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a semiconductor-on-insulator (SOI) substrate and a transfer substrate for a semiconductor device is illustratively depicted according to aspects of the present invention.

According to aspects of the invention, a semiconductor device 1 can be formed using a transfer process. In such a transfer a process, a substrate 100 and dielectric layer 102 receives a transfer substrate 101 carrying a heat conducting dielectric 104 to form a semiconductor-on-insulator (SOI) substrate.

The substrate 100 may include, e.g., silicon, or any suitable semiconducting material (for example, silicon germanium (SiGe), gallium arsenide (GaAs), silicon carbide (SiC), polycrystalline silicon, and other group IV, III-V, II-VI and semiconducting materials). The buried oxide layer 102 is then formed over the substrate 100 to form the SOI substrate. The dielectric layer 102 may include a suitable dielectric material formed of a suitable oxide. For example, the dielectric layer 102 can include, e.g., silicon dioxide ($SiO_2$), however other dielectric oxides may be used. The dielectric layer 102 may be formed using a deposition process such as, e.g., physical vapor deposition (PVD), chemical vapor deposition (CVD) and atomic layer deposition (ALD) among others. Alternatively, the dielectric layer 102 may be grown over the substrate 100 using an epitaxial process, such as, e.g., molecular beam epitaxy (MBE), vapor phase epitaxy (VPE), solid phase epitaxy (SPE) and liquid phase epitaxy (LPE) among others.

Similarly, the transfer substrate 101 can include a suitable semiconducting material, such as, e.g., silicon, SiGe, GaAs, SiC, polycrystalline Si, and other group IV, III-V, II-VI and semiconducting materials. According to aspects of an embodiment of the present invention, the transfer substrate 101 is formed from the same material as the substrate 100 (for example, silicon). However, the transfer substrate 101 and the substrate 100 can be formed of different materials.

The heat conducting dielectric 104 is formed over the transfer substrate 101 by a suitable process, such as, e.g., a deposition process or epitaxial process including those described above. The heat conducting dielectric 104 can include a suitable dielectric material that is the same or different from the buried dielectric 102. The dielectric may include, for example, high thermal conductivity dielectrics, such as, e.g., aluminum oxide ($Al_2O_3$), yttrium oxide ($Y_2O_3$), and silicon nitride (SiN), among others. High thermal conductivity dielectrics may further include, e.g., any dielectric material having a thermal conductivity of at least 10 Watts per meter-Kelvin (W/mK). Additionally, more complex dielectric layers may be formed to improve certain properties of the heat conducting dielectric 104. For example, bilayers or other multilayers may be employed, and materials that ordinarily could not practically be formed on a buried dielectric may be employed, such as, e.g., hafnium oxide ($HfO_2$), iridium oxide ($IrO_2$), silicon nitrides (such as silicon boron nitride (SiBN) and silicon boron-carbon nitride (SiBCN)) and others. Therefore, using a transfer substrate 101 to form the heat conducting dielectric 104 permits burying an additional dielectric layer in the SOI including a broader range of materials to be used that have high thermal conductivity and low electrical conductivity.

Figure 2:
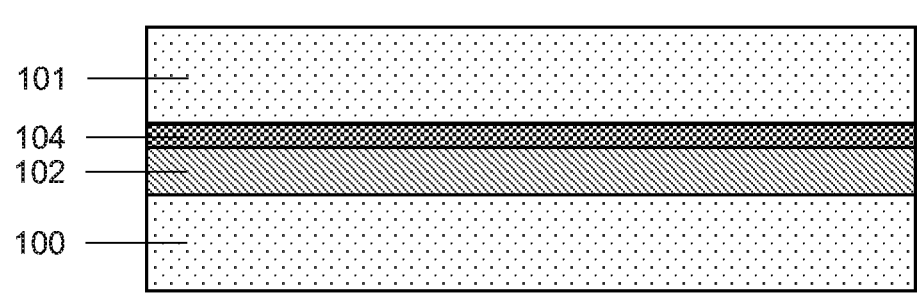
FIG. 2 is a cross-sectional view of a buried oxide (BOX) engineered SOI substrate for a semiconductor device, in accordance with an embodiment of the present invention.

Referring now to FIG. 2, a buried oxide (BOX) engineered SOI substrate for a semiconductor device is illustratively depicted according to aspects of the present invention.

According to aspects of the present invention, a SOI substrate can be formed, including a substrate 100 with a dielectric layer 102, heat conducting dielectric 104 and transfer substrate 101. To form the SOI substrate for the semiconductor device 1, the transfer substrate 101 can be flipped so that the heat conducting dielectric 104 faces the dielectric layer 102 on the substrate 100. The transfer substrate 101 and heat conducting dielectric 104 can then be transferred to the dielectric layer 102 on the substrate 100. Other methods of forming the substrate 100, dielectric layer 102, heat conducting dielectric 104 and transfer substrate 101 may be used, however, such as, e.g., a series of deposition processes, transfer processes or epitaxial growth, or combinations thereof.

As discussed above, using a transfer process to position the heat conducting dielectric 104 on the dielectric layer 102 to form a combination buried dielectric within the SOI permits the use of materials that would otherwise be impractical or even impossible to use. Thus, the semiconductor device 1 may include a buried dielectric including multiple layers with at least one heat conducting dielectric 104 formed on at least one dielectric layer 102, where the heat conducting dielectric 104 includes materials that cannot be reliably or efficiently grown or deposited on the dielectric layer 102. These materials may include complex dielectrics, such as, e.g., SiBN, SiBCN and other silicon nitrate compounds, or metal oxides such as, e.g., $Al_2O_3$, $HfO_2$, $Y_2O_3$ and $IrO_2$. The heat conducting dielectric 104 may even include combinations of materials to further fine tune the electrical and thermal characteristics of the layer.

Figure 3:
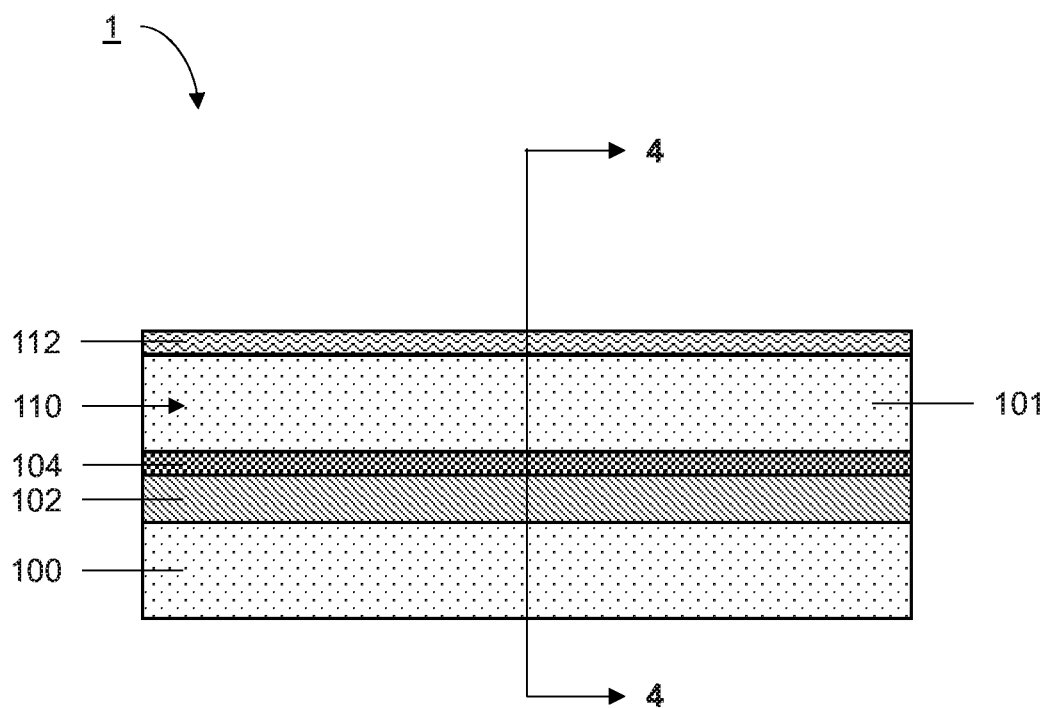
FIG. 3 is a side view showing a BOX engineered SOI substrate with fins etched therein for a semiconductor device, in accordance with an embodiment of the present invention.

Referring now to FIG. 3, a side view of a BOX engineered SOI substrate with fins etched therein for a semiconductor device is illustratively depicted according to aspects of the present invention.

According to aspects of the invention, fins 110 may be formed in the transfer substrate 101. The forming the fins 110 may include depositing a hardmask 112 over the transfer substrate 101 and patterning the hardmask 112. Using the patterned hardmask 112, the transfer substrate 110 may be etched down to the dielectric layer 102 for form fins 110 in the semiconductor device 1. The fins 110 may be etched according to a suitable etch process including either isotropic or anisotropic etching. Examples of suitable etch processes include, e.g., liquid-phase (or wet) etching, or plasma phase (dry) etching including reactive ion etching (RIE).

Figure 4:
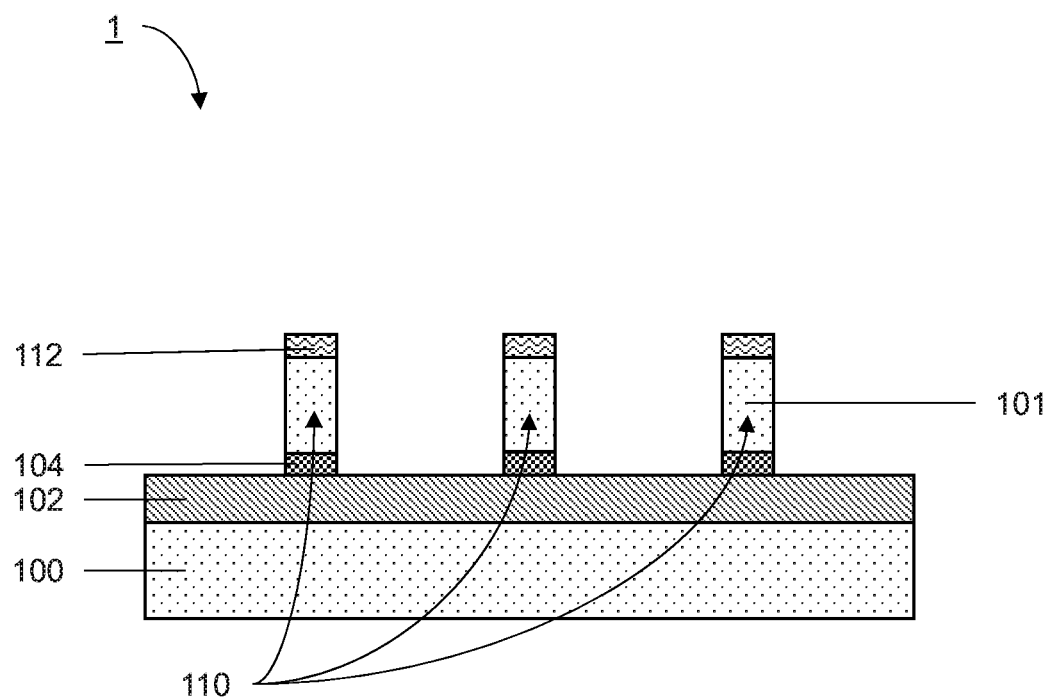
FIG. 4 is a cross-sectional view along section line 4-4 of FIG. 3 showing the BOX engineered SOI substrate of FIG. 3 with fins etched therein for a semiconductor device, in accordance with an embodiment of the present invention.

Referring now to FIG. 4, a view of the cross-section along section line 4-4 of FIG. 3 of a BOX engineered SOI substrate with fins etched therein for a semiconductor device is illustratively depicted according to aspects of the present invention.

In a view of the cross-section along section line 4-4 of FIG. 3, fins 110 are depicted. Any number of fins 110 may be included in the semiconductor device 1; however, for illustrative purposes, three are depicted. As discussed in reference to FIG. 3, the fins 110 may be etched into the transfer substrate 101 and heat conducting dielectric 104 down to the dielectric layer 102 using the hardmask 112 for the pattern. As a result, the fins 110 are formed of a hardmask 112 portion, a transfer substrate 101 portion and a heat conducting dielectric 104 portion in substantially vertical alignment. Because the heat conducting dielectric 104 is etched as part of the fin etching process, the heat conducting dielectric 104 forms a thermally conductive pad on which the fin is formed.

Figure 5:
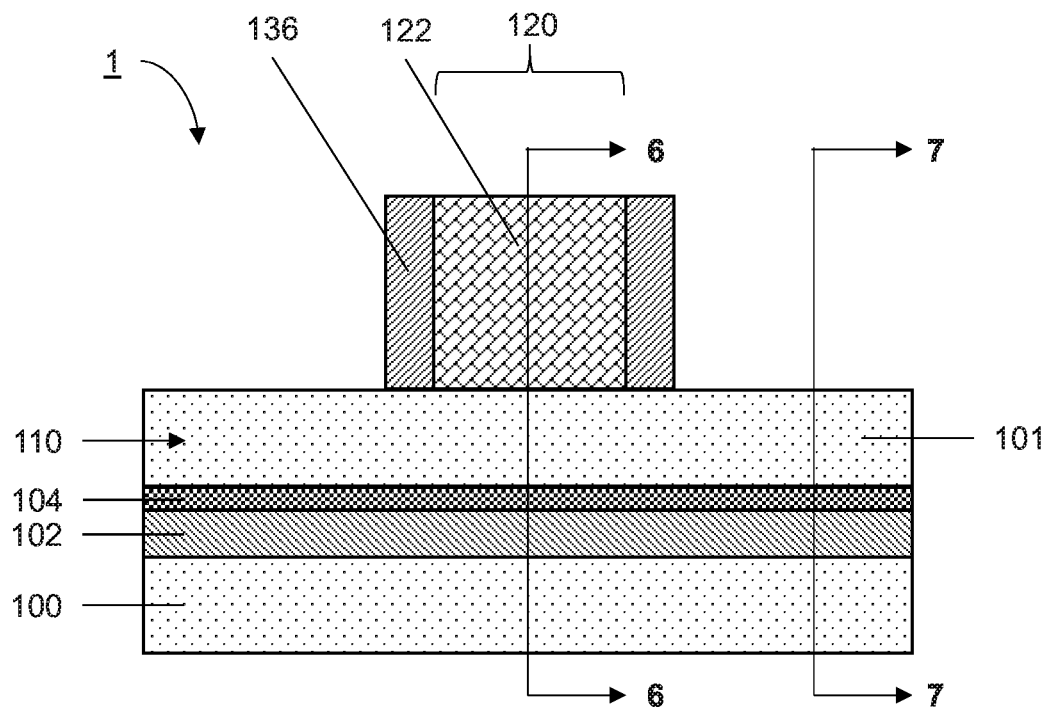
FIG. 5 is a cross-sectional view showing a semiconductor device having a dummy gate with spacers formed thereon, in accordance with an embodiment of the present invention.

Referring now to FIG. 5, a semiconductor device having a dummy gate with spacers formed thereon is illustratively depicted according to aspects of the present invention.

According to aspects of the present invention, a dummy gate 120 can be formed over the semiconductor device 1. In doing so, the hardmask 112 is removed from the fins 110 by a selective etch process or a planarization process (for example, chemical mechanical planarization (CMP)). The dummy gate 120 can then be formed over and around the fins 110 of the semiconductor device 1. The dummy gate 120, therefore, extends in a transverse direction relative to the fins 110.

The dummy gate 120 can include a dummy gate material 122. The dummy gate material 122 can include a suitable sacrificial material, such as, e.g., amorphous or polycrystalline silicon. A dummy gate cap (not shown) can be formed thereon from a material such as, e.g., silicon nitride (SiN) or other nitride or material suitable to serve as a hardmask for subsequent process, as will be described below. The dummy gate material 122 can be formed using a deposition process including, e.g., PVD, CVD, or other suitable deposition process.

A plurality of dummy gates 120 can be formed over the fins 110. Each of the dummy gates 120 can therefore be longitudinally spaced along the fins 110.

Additionally, spacers 136 may be formed on each side of the dummy gate 120. The spacers 136 can be formed, e.g., according to a conformal deposition process where a layer of the gate spacer material, such as, e.g., SiN or any other suitable spacer material, is conformally deposited over the semiconductor device 1. The gate spacer material on horizontal surfaces is then removed, for example, by directional etch (e.g., reactive ion etch (RIE)), to leave only the vertical gate spacers 136.

Figure 6:
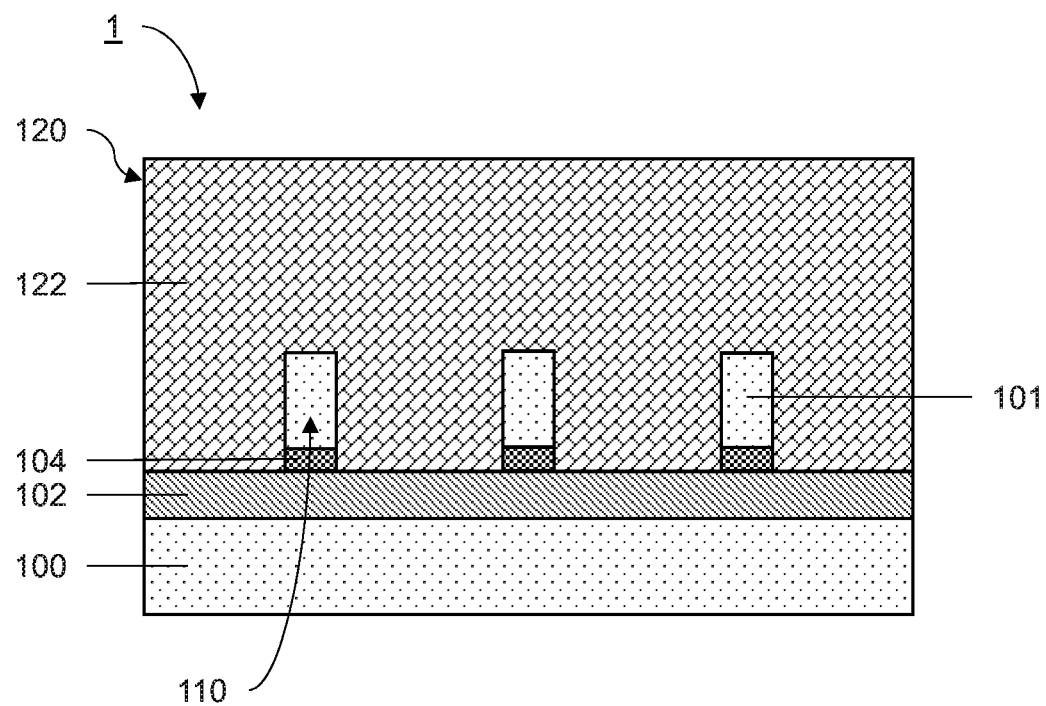
FIG. 6 is a cross-sectional view along section line 6-6 of FIG. 5 showing a semiconductor device having fins formed thereon with a dummy gate formed across the fins, in accordance with an embodiment of the present invention.

Referring now to FIG. 6, a view of the cross-section along section line 6-6 of FIG. 5 showing the semiconductor device 1 of FIG. 5 where the dummy gate material 122 of the dummy gate 120 is depicted extending over around the fins 110 across the semiconductor device 1.

Figure 7:
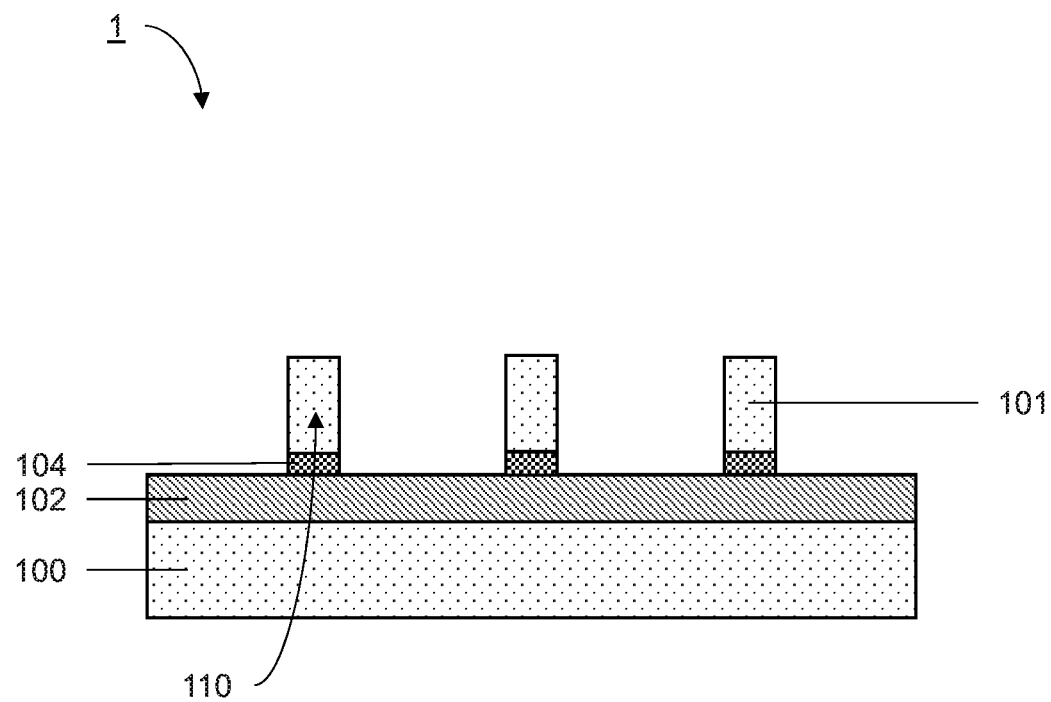
FIG. 7 is a cross-sectional view along section line 7-7 of FIG. 5 showing a semiconductor device having fins formed thereon, in accordance with an embodiment of the present invention.

Referring now to FIG. 7, which depicts a cross section of the semiconductor device 1 along section line 7-7 of FIG. 5, where the fins 110 are shown in a portion of the semiconductor device 1 not covered by the dummy gate 120.

Figure 8:
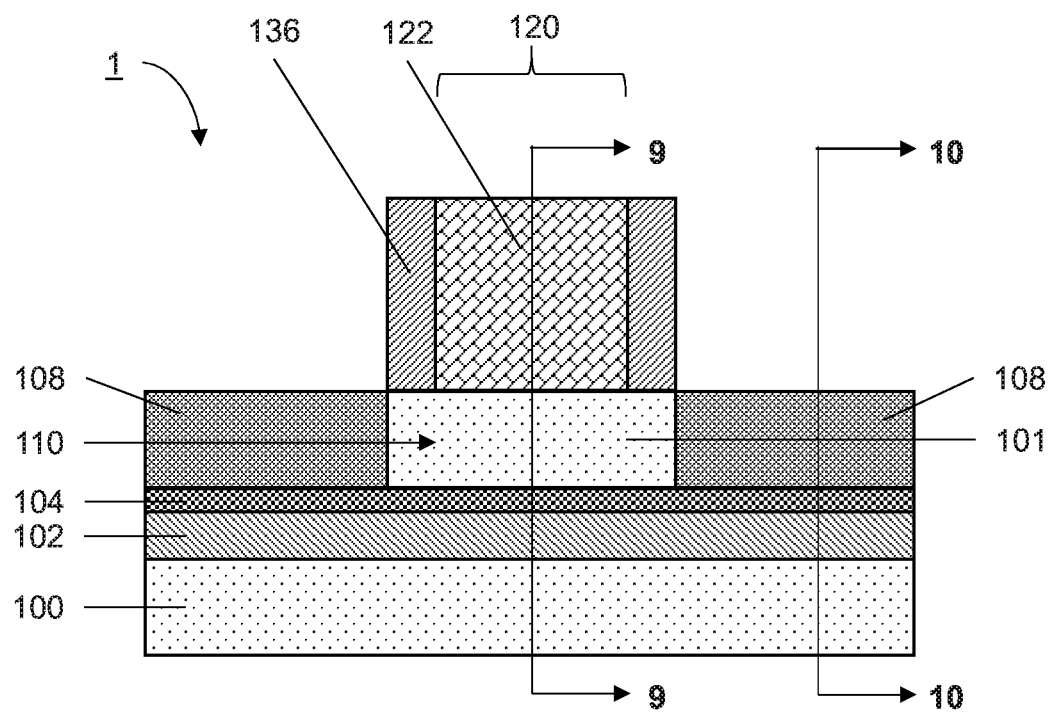
FIG. 8 is a cross-sectional view showing a system/method a semiconductor device having a dummy gate with spacers formed thereon and source or drain (source/drain) regions formed over exposed fins, in accordance with an embodiment of the present invention.

Referring now to FIG. 8, a semiconductor device having a dummy gate with spacers formed thereon and source/drain regions formed over exposed fins is illustratively depicted according to aspects of the present invention.

The semiconductor device 1 can include source/drain regions 108 adjacent to each spacer 136. The source/drain regions 108 can be grown from the fins 110 using, e.g., an epitaxial growth process. The source/drain regions 108 can include conductive materials suitable for epitaxial growth from fins 110. Such materials can include, e.g., undoped or doped silicon and silicon alloys (for example, silicon germanium (SiGe) doped with boron for a pFET or silicon doped with phosphorus for an nFET).

The source/drain regions 108 can be grown by an epitaxial process such as, e.g., molecular beam epitaxy (MBE), vapor phase epitaxy, solid phase epitaxy, liquid phase epitaxy, or other suitable growth process. The epitaxially grown source/drain regions 108 can include a doped material that is doped, e.g., in situ, or through a separate process from the epitaxially growth of the source/drain regions 108. In the latter case, the source/drain regions 108 can be doped through diffusion or by ion implantation, and can be performed using, e.g., a separate vapor phase epitaxy step.

Figure 9:
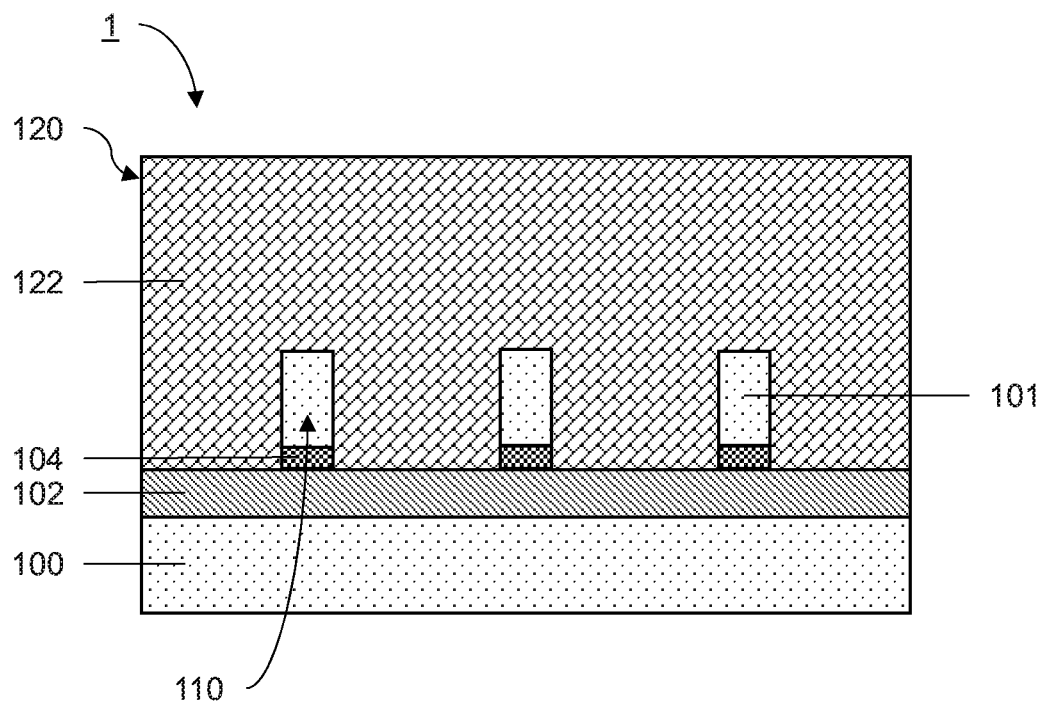
FIG. 9 is a cross-sectional view along section line 9-9 of FIG. 8 showing a semiconductor device having a dummy gate formed transversely across fins, in accordance with an embodiment of the present invention.

Referring now to FIG. 9, illustratively depicting the fins 110 of the semiconductor device 1 of FIG. 8 along section line 9-9 where the dummy gate material 122 of the dummy gate 120 extends over around the fins 110 across the semiconductor device 1.

Figure 10:
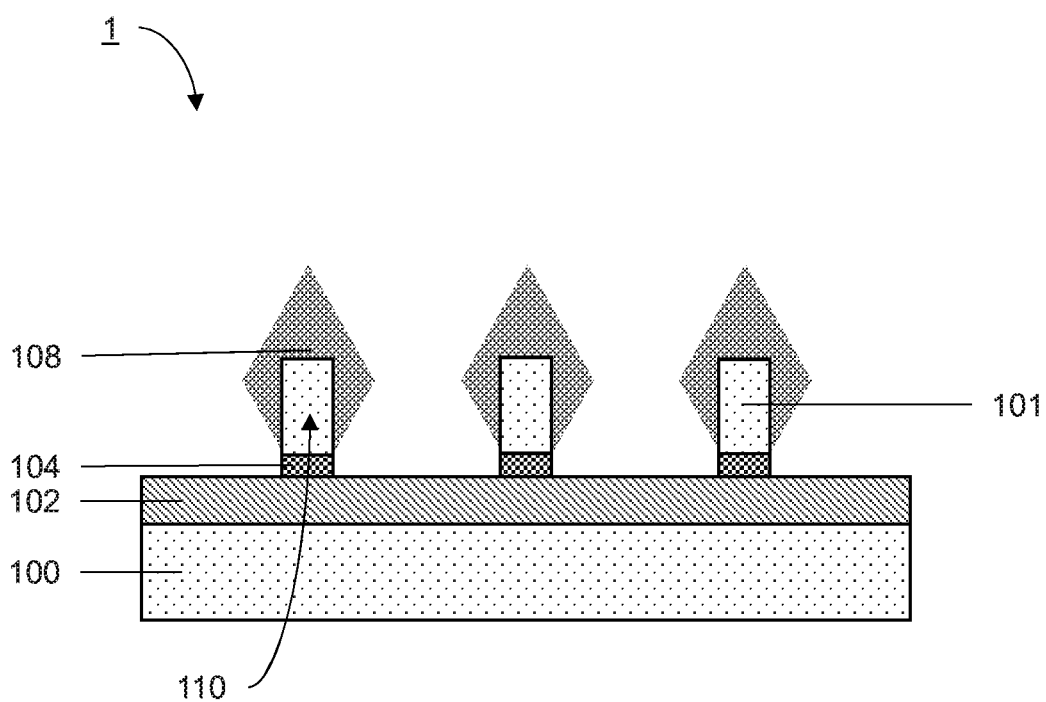
FIG. 10 is a cross-sectional view along section line 10-10 of FIG. 8 showing a semiconductor device having source/drain regions formed over exposed fins, in accordance with an embodiment of the present invention.

Referring now to FIG. 10, illustratively depicting the fins 110 of the semiconductor device 1 of FIG. 5 along section line 10-10 where the fins 110 are shown in a portion of the semiconductor device 1 not covered by the dummy gate 120 with the source/drain regions 108 grown from the fins 110.

Figure 11:
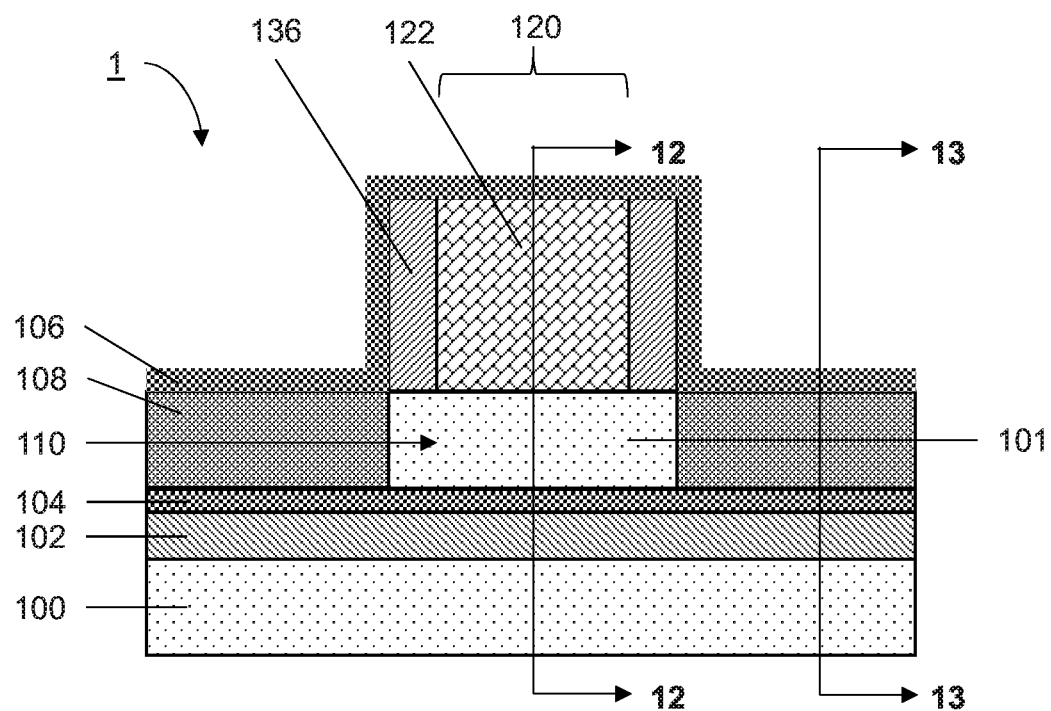
FIG. 11 is a cross-sectional view showing a semiconductor device having a heat conducting layer formed over the semiconductor device, in accordance with an embodiment of the present invention.

Referring now to FIG. 11, a semiconductor device having a heat conducting layer formed over the semiconductor device is illustratively depicted according to aspects of the present invention.

According to aspects of the present invention, the semiconductor device 1 can include a heat conducting coating 106. The heat conducting coating 106 can be conformally deposited over the semiconductor device 1, including over the dummy gate 120 and spacers 136, and the source/drain regions 108. The heat conducting coating 106 may be deposited using a suitable deposition process, such as, e.g., PVD, CVD, MBE and atomic layer deposition (ALD) among others. Accordingly, the heat conducting coating 106 forms a coating over the entire top surface of the semiconductor device 1, including all of the components formed thereon. Thus, the heat conducting coating 106 forms a thermally conductive encapsulation around each component formed on the semiconductor device 1.

The heating conducting coating 106 is formed from a heat conducting material, such as those used in the heat conducting dielectric 104. As such, the heat conducting coating 106 can be a dielectric material including, e.g., $Al_2O_3$, $Y_2O_3$, and SiN, among others. The heat conducting coating 106 may be the same material as the heat conducting dielectric 104, however each of these layers may alternatively be formed of different materials. As a result, the component of the semiconductor device 1 are encapsulated in material with a high thermal conductivity, being formed over the heat conducting dielectric 104 with the heat conducting coating 106 covering the semiconductor device 1 from the top. This encapsulation includes, not only a coating surround each component, such as the source/drain regions 108, but also reforms a thermally conductive material over the dielectric layer 102 to complete the two part buried oxide outside of the dummy gate 120.

By reforming a thermally conductive material on the dielectric layer 102 outside of the dummy gate 120, there is more thermally conductive material outside of a gated region defined by the dummy gate 120 than in the gated region. Thus, heat is transferred away from a gate. Encapsulating the fins 110 and the source/drain regions 108 in the heat conducting coating 106 further facilitates this flow of heat away from a gate. Thus, the source/drain regions 108 on the fins 110 are fully encapsulated by material with a high thermal conductivity and low electrical conductivity for improved heat transfer away from channel regions of the semiconductor device 1.

Figure 12:
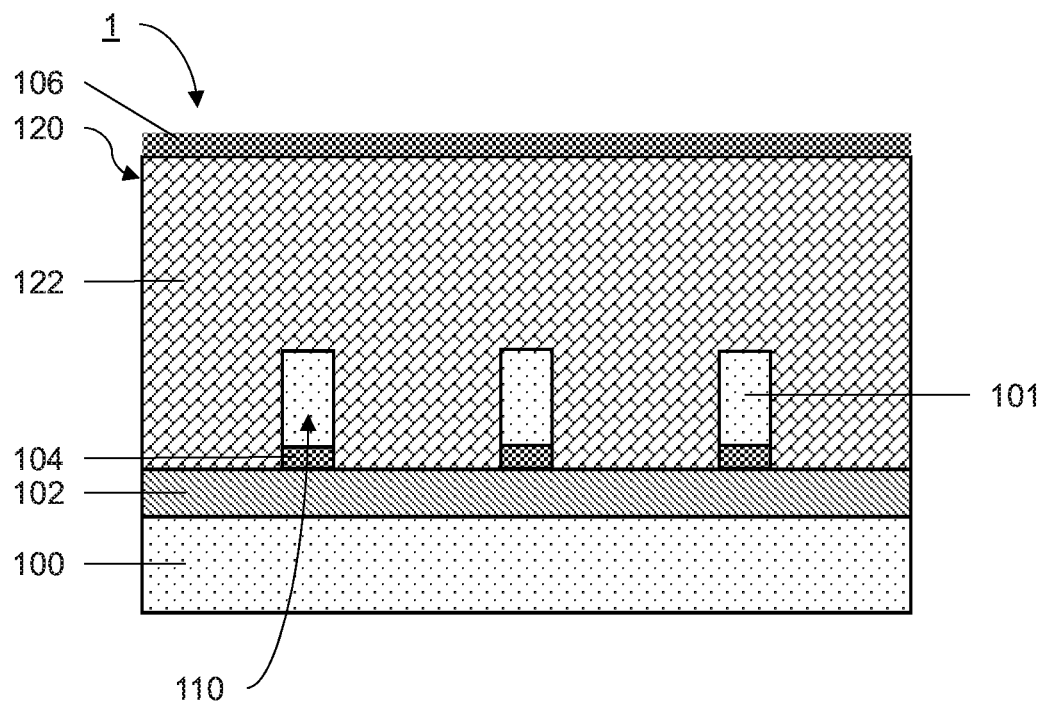
FIG. 12 is a cross-sectional view along section line 12-12 of FIG. 11 showing a semiconductor device having a heat conducting layer formed over a dummy gate, in accordance with an embodiment of the present invention.

Referring now to FIG. 12, the semiconductor 1 of FIG. 11 is illustratively depicted along section line 12-12 of FIG. 11, showing the fins 110 covered by the dummy gate material 122 of the dummy gate 120, with a layer of heat conducting coating 106 formed over the dummy gate 120 according to aspects of the present invention.

Figure 13:
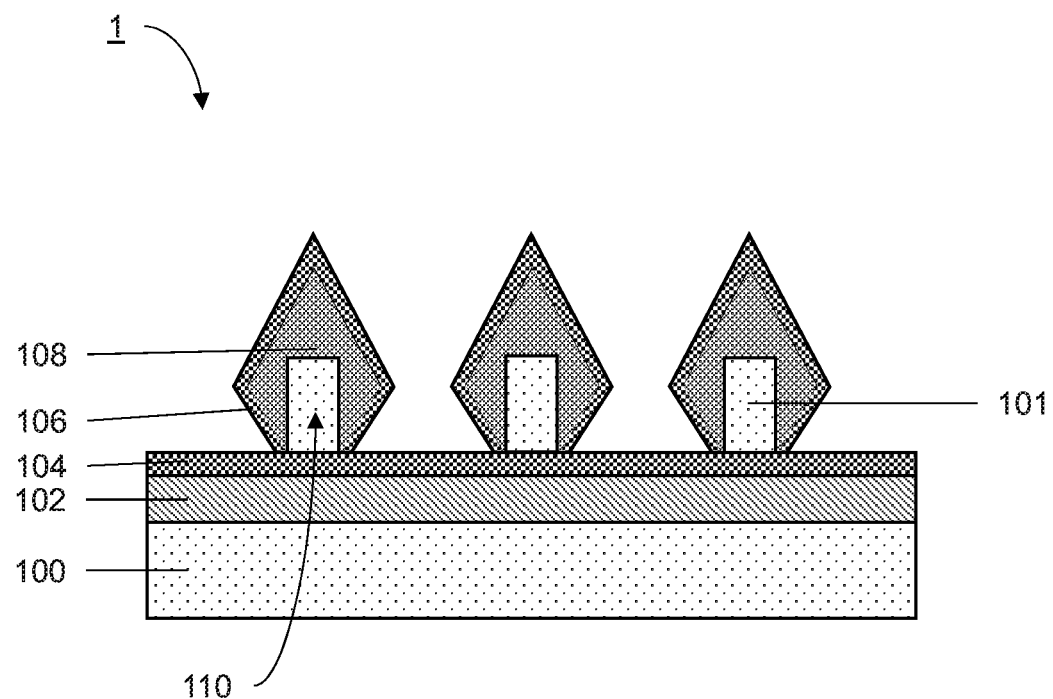
FIG. 13 is a cross-sectional view along section line 13-13 of FIG. 11 showing a semiconductor device having a heat conducting layer formed over source drain regions on fins and over a SOI, in accordance with an embodiment of the present invention.

Referring now to FIG. 13 the semiconductor 1 of FIG. 11 is illustratively depicted along section line 13-13 of FIG. 11, showing the fins 110 in the source/drain region 108, with a layer of heat conducting coating 106 formed around the source/drain regions 108 on the fins 110 according to aspects of the present invention.

Figure 14:
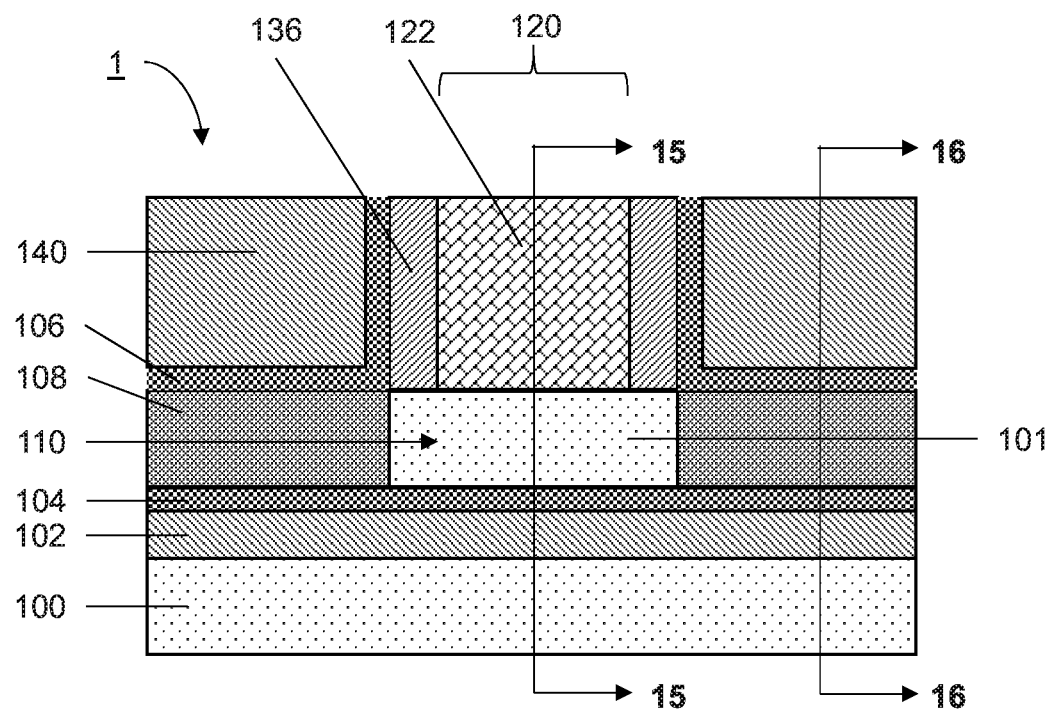
FIG. 14 is a cross-sectional view showing a semiconductor device having an interlevel dielectric (ILD) burying a dummy gate and fins with source/drain regions, in accordance with an embodiment of the present invention.

Referring now to FIG. 14, the semiconductor device having an interlevel dielectric (ILD) burying the dummy gate and the fins with source/drain regions is illustratively depicted according to aspects of the present invention.

The semiconductor device 1 can have an ILD 140 formed to burying the dummy gate 120 and the fins 110 with source/drain regions 108. As a result, the ILD 140 also buries the heat conducting coating 106 encapsulating each of the source/drain regions 108, fins 110 and dummy gate 120. Thus, the ILD 140 insulates the various components from each other, thus reducing electrical interference between the components, such as each fin 110 on the semiconductor device 1.

The ILD 140 can be deposited by any suitable deposition process, such as those described above. To further facilitate the electrical insulation of components, the ILD 140 can be formed, for example, of a, e.g., low-k dielectric material such as silicon dioxide ($SiO_2$).

The ILD 140 and a horizontal portion of the heat conducting coating 106 are planarized down to a top of the dummy gate 120. Thus the top of the dummy gate 120 and the dummy gate material 122 are exposed. The planarization may be accomplished in one or more planarization steps, such as, e.g., planarizing both the ILD 140 and the heat conducting coating 106 after formation of the ILD 140, or by first planarizing the heat conducting coating 106 down to the top of the dummy gate 120 and then depositing and planarizing the ILD 140 down to the top of the dummy gate 120. Each of the one or more planarization steps may be performed according to a, e.g., CMP process or other suitable planarization process.

Figure 15:
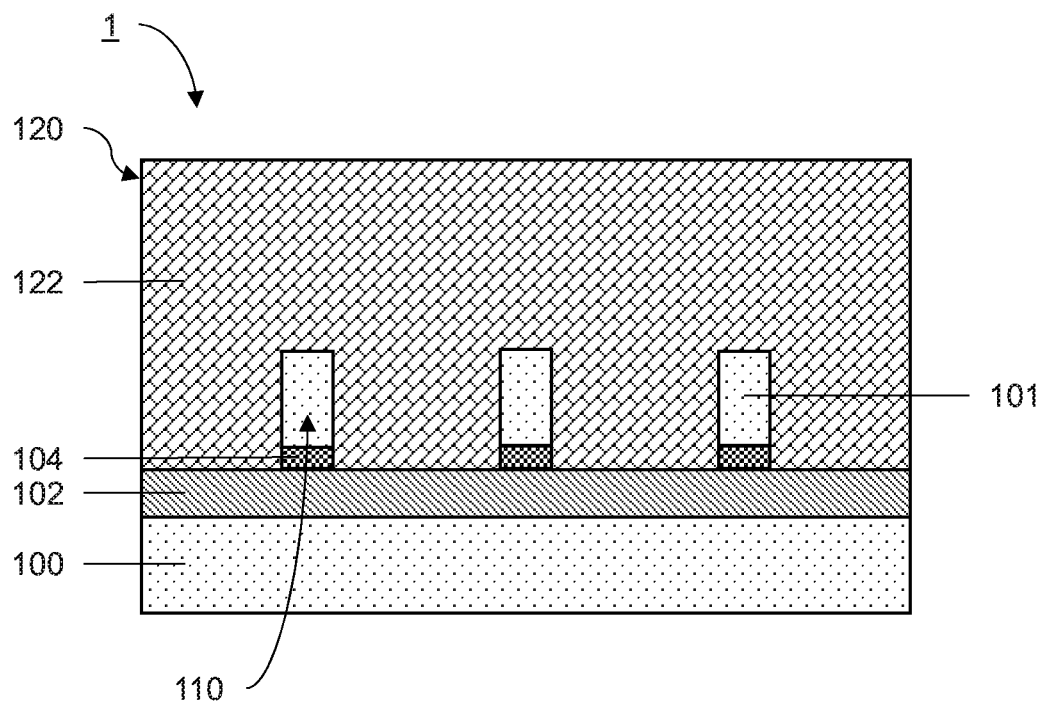
FIG. 15 is a cross-sectional view along section line 15-15 of FIG. 14 showing a semiconductor device having a dummy gate formed transversely across fins, in accordance with an embodiment of the present invention.

Referring now to FIG. 15, the semiconductor 1 of FIG. 14 is illustratively depicted along section line 15-15 of FIG. 14, showing the fins 110 covered by the dummy gate material 122 of the dummy gate 120, with the layer of heat conducting coating 106 having been removed according to aspects of the present invention.

Figure 16:
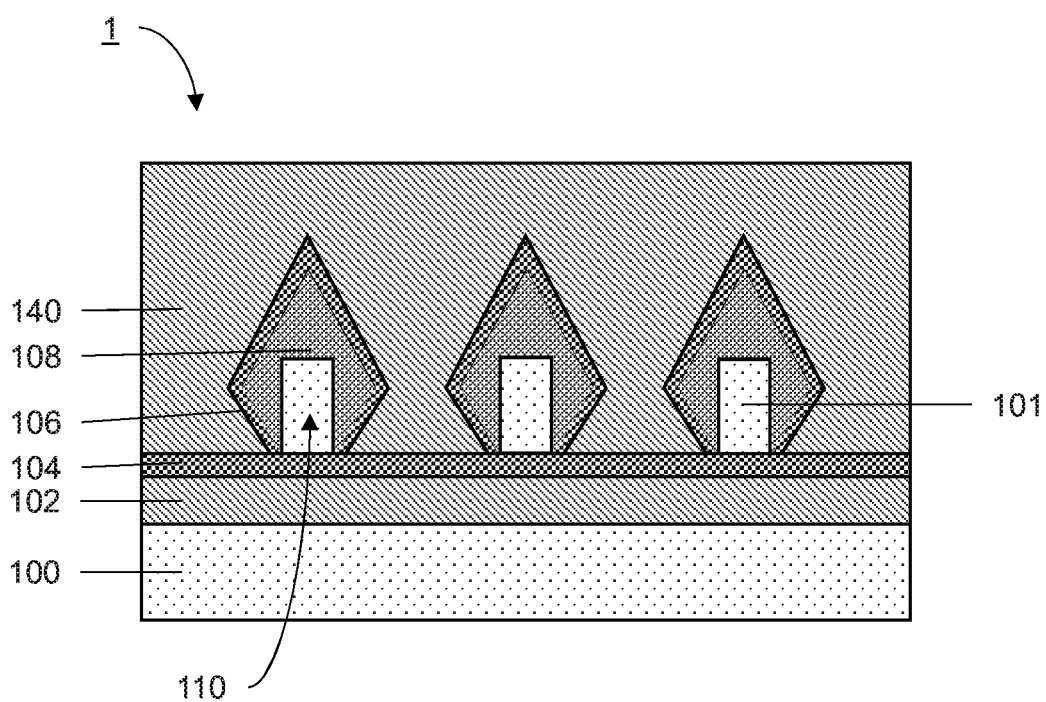
FIG. 16 is a cross-sectional view along section line 16-16 of FIG. 14 showing a semiconductor device having an interlevel dielectric (ILD) burying fins with source/drain regions, in accordance with an embodiment of the present invention.

Referring now to FIG. 16, the semiconductor 1 of FIG. 14 is illustratively depicted along section line 16-16 of FIG. 14, showing the fins 110 in the source/drain region 108 being buried in the ILD 140 with the layer of heat conducting coating 106 encapsulating the source/drain regions 108 within the ILD 140 according to aspects of the present invention.

Figure 17:
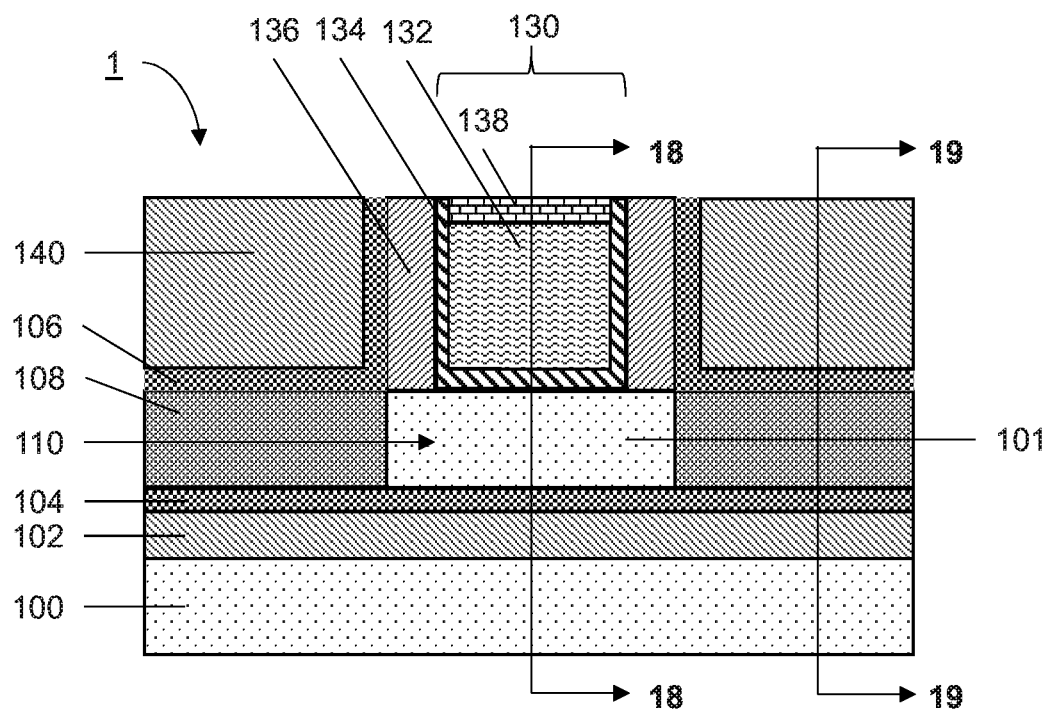
FIG. 17 is a cross-sectional view showing a semiconductor device having a dummy gate replaced with a gate conductor and gate dielectric, in accordance with an embodiment of the present invention.

Referring now to FIG. 17, the semiconductor device having the dummy gate replaced with a gate conductor and gate dielectric is illustratively depicted according to aspects of the present invention.

The dummy gate 120, having been exposed through the ILD 140, can be replaced with a gate 130. The dummy gate material 122 may be recessed down to the fin 110 in a channel region, and down to the dielectric layer 102 outside of the channel region. The recessing can be performed with a suitable etch process, such as those described above, including, e.g., a direction or isotropic etch such as RIE. Because the dummy gate material 122 is different than a material of the spacers 136, a selective etch process may selectively remove the dummy gate material 122 without damaging the spacers 136.

The gate 130 can be formed in place of the dummy gate 120 by depositing a gate dielectric 134. The gate dielectric 134 can be any suitable dielectric material, including, e.g., any high-k material (for example, $SiO_2$, SiN or a suitable metal oxide). The gate dielectric 134 can be formed as a layer in between the spacers 136 to line a gate region therein. The gate dielectric 134 may be formed with a suitable deposition process, including those described above.

Within the gate region between the spacers 136, a gate conductor 132 may be deposited. The gate conductor 132 can be formed with a suitable deposition process, such as those described above. The gate conductor 132 can be any suitable conducting material, including but not limited to, doped polycrystalline or amorphous silicon, germanium, silicon germanium, a metal, a conducting metallic compound material, carbon nanotube, conductive carbon, graphene, or any suitable combination of these materials. The conductive material can further comprise dopants that are incorporated during or after deposition. In some embodiments, the gate conductor 132 includes a work function metal layer to set the threshold voltage of the gate 130 to a desired value. The work function layer can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

A gate cap 138 can be formed on top of the gate conductor 132. The gate caps 138 are formed by recessing the gate conductor 132 down to a desired height. An insulating material such as, e.g., an oxide or a nitride (for example, silicon nitride) is then deposited within the recess of each gate conductor 132 between the gate spacers 136. Accordingly, gates 130 are formed within the ILD 140 of the semiconductor device 1.

Figure 18:
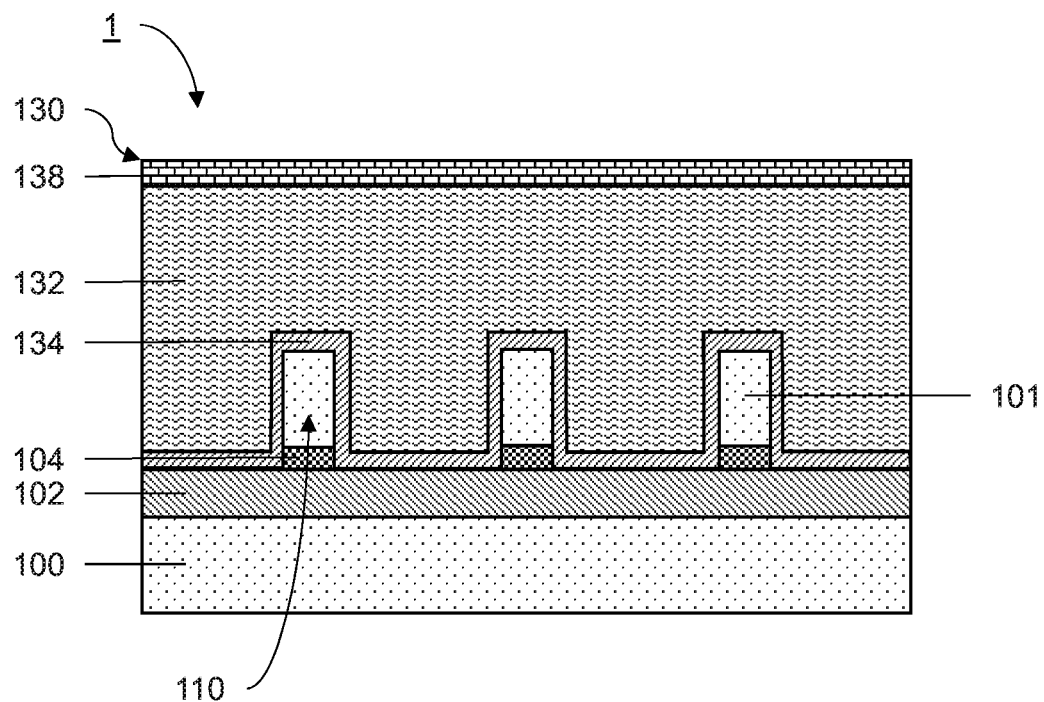
FIG. 18 is a cross-sectional view along section line 18-18 of FIG. 17 showing a semiconductor device having a gate conductor and gate dielectric formed transversely across fins, in accordance with an embodiment of the present invention.

Referring now to FIG. 18, the semiconductor 1 of FIG. 17 is illustratively depicted along section line 18-18 of FIG. 17, showing the fins 110 covered by a conformal layer of the gate dielectric 134 with the dummy conductor 132 and gate cap 138 formed thereon according to aspects of the present invention.

Figure 19:
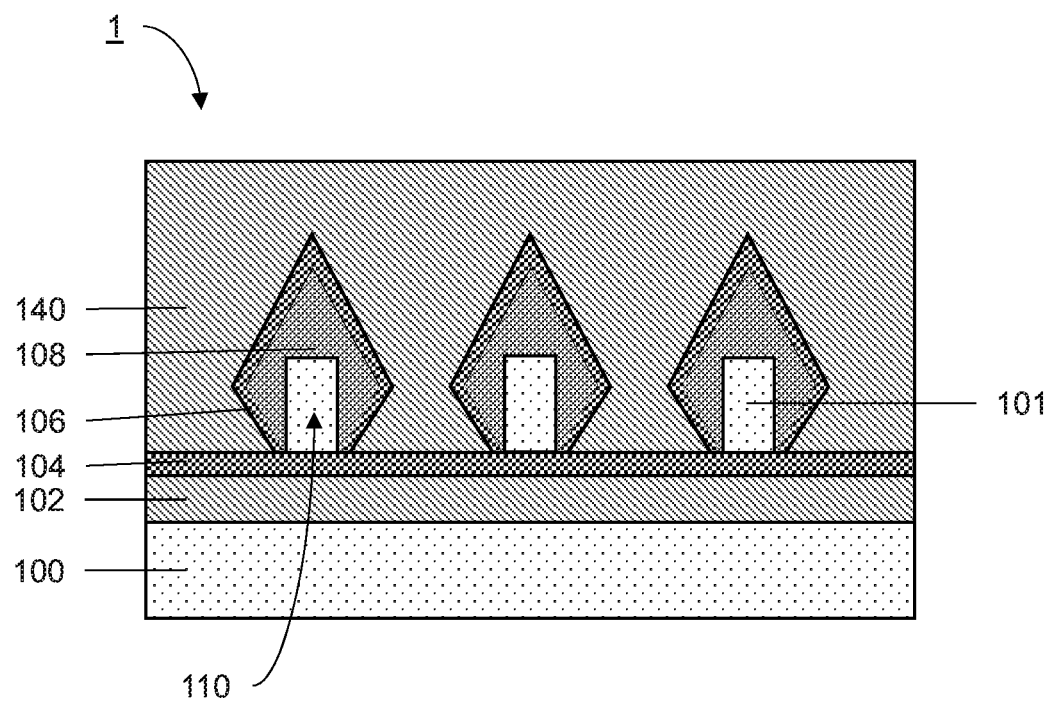
FIG. 19 is a cross-sectional view along section line 19-19 of FIG. 17 showing a semiconductor device having an interlevel dielectric (ILD) burying fins with source/drain regions, in accordance with an embodiment of the present invention.

Referring now to FIG. 19, the semiconductor 1 of FIG. 17 is illustratively depicted along section line 19-19 of FIG. 17, showing the fins 110 in the source/drain region 108 being buried in the ILD 140 with the layer of heat conducting coating 106 encapsulating the source/drain regions 108 within the ILD 140 according to aspects of the present invention.

Figure 20:
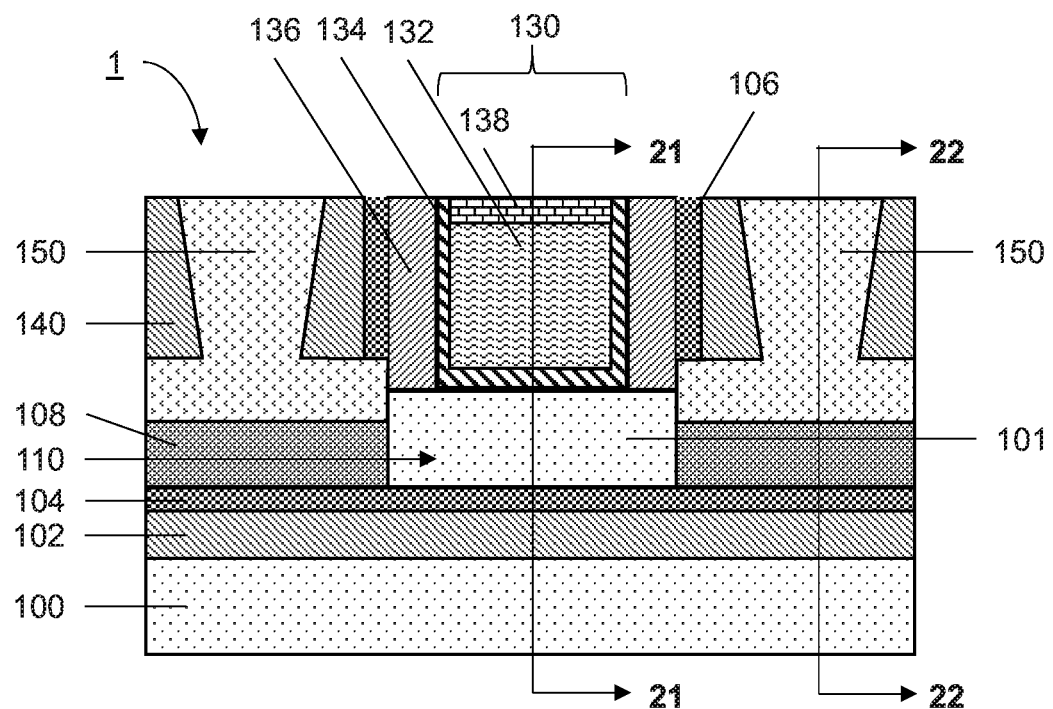
FIG. 20 is a cross-sectional view showing a semiconductor device having source/drain contacts extending through an ILD to source/drain regions on each side of a gate, in accordance with an embodiment of the present invention.

Referring now to FIG. 20, the semiconductor device having source/drain contacts extending through the ILD to the source/drain regions on each side of the gate is illustratively depicted according to aspects of the present invention.

Source/drain contacts 150 can be formed in the semiconductor device 1. Vias can be opened up through the ILD 140 down to each of the source/drain regions 108 formed on the fins 110 adjacent to each side of the gate 130. The vias may be opened up using a selective etch process, such as, e.g., RIE, using a patterned mask over the ILD 140. The selective etching may be configured to selectively etch both the ILD 140 and the heat conducting coating 150. This can be accomplished by a single etch process that selects both the ILD 140 and the heat conducting coating 106, or through multiple separate process that select each layer individually. As a result, the vias may extend through the ILD 140 and the heat conducting coating 106, thus exposing the source/drain regions 108.

The vias may then be filled with a conductive material to from the source/drain contacts 150. The conductive material is thus in direct contact with the source/drain regions 108 grown from the fins 110 and exposed at an upper surface of the ILD 140. The source/drain contacts 150 can be any suitable conducting material, including but not limited to, doped polycrystalline or amorphous silicon, germanium, silicon germanium, a metal, a conducting metallic compound material, carbon nanotube, conductive carbon, graphene, or any suitable combination of these materials.

The resulting semiconductor device 1 may then undergo subsequent processing steps. Such steps may include, e.g., soldering and other connecting steps for connecting to other devices, and any other subsequent process steps for creating and implementing a fin FET. Such implementations may include, e.g., as transistors for a processor or memory device (for example, random access memory (RAM), flash storage, etc.).

Figure 21:
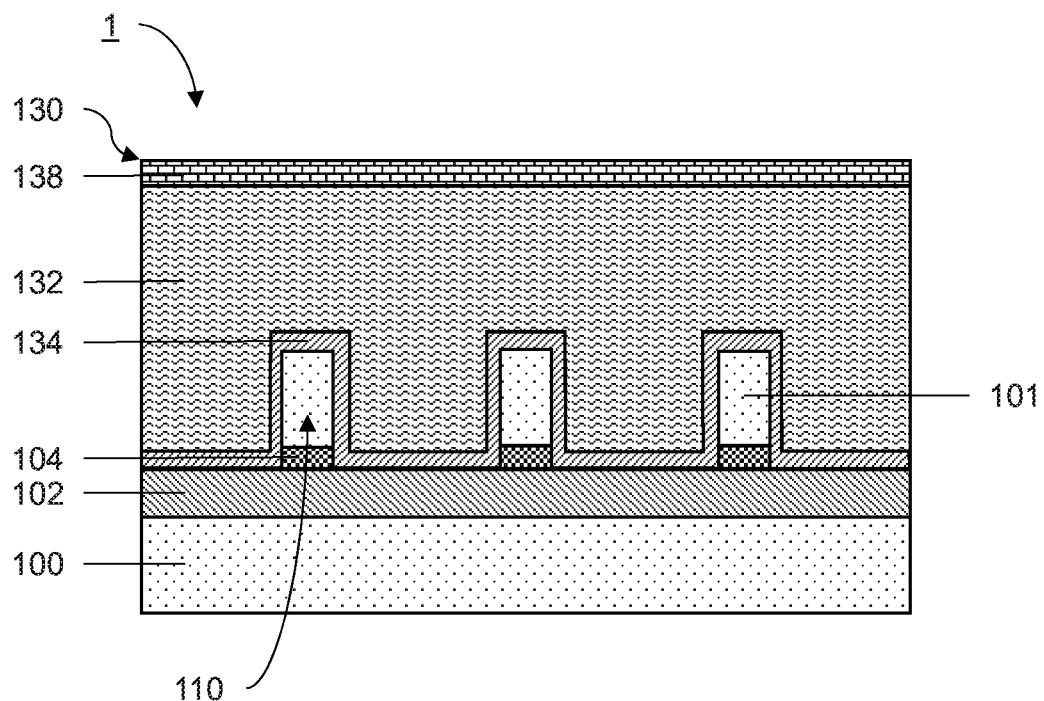
FIG. 21 is a cross-sectional view along section line 21-21 of FIG. 20 showing a semiconductor device having a gate conductor and gate dielectric formed transversely across fins, in accordance with an embodiment of the present invention.

Referring now to FIG. 21, the semiconductor 1 of FIG. 20 is illustratively depicted along section line 21-21 of FIG. 20, showing the fins 110 covered by a conformal layer of the gate dielectric 134 with the gate conductor 132 and gate cap 138 formed thereon according to aspects of the present invention.

Figure 22:
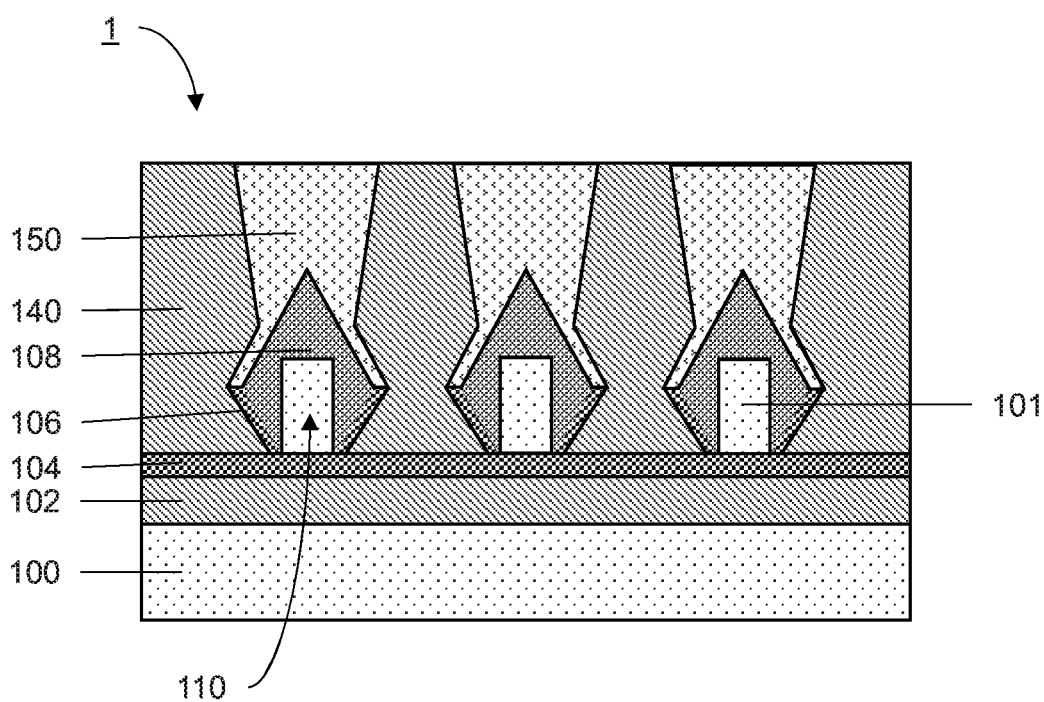
FIG. 22 is a cross-sectional view along section line 22-22 of FIG. 20 showing a semiconductor device having source/drain contacts extending through an ILD to source/drain regions on each side of a gate, in accordance with an embodiment of the present invention.

Referring now to FIG. 22, the semiconductor 1 of FIG. 20 is illustratively depicted along section line 22-22 of FIG. 20, showing the fins 110 with the layer of heat conducting coating 106 encapsulating a bottom portion of the source/drain regions 108 and source/drain contacts 150 formed through the ILD 140 and replacing the heat conducting coating 106 on an upper portion of the source/drain regions 108 according to aspects of the present invention.

Figure 23:
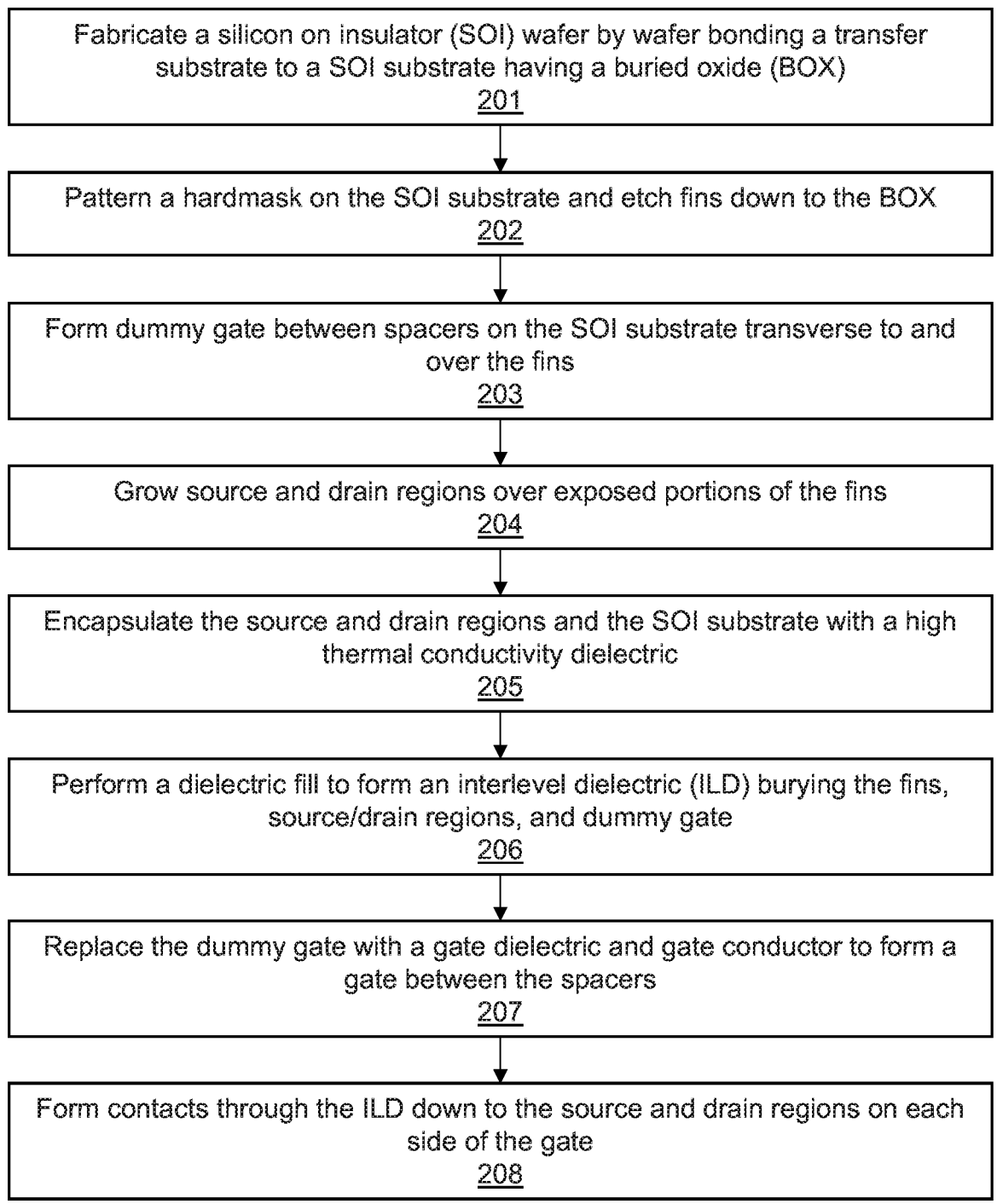
FIG. 23 is a block/flow diagram depicting the formation of a semiconductor device having high thermal conductivity dielectrics formed therein, in accordance with an embodiment of the present invention.

Referring now to FIG. 23, the formation of a semiconductor device having high thermal conductivity dielectrics formed therein is illustratively depicted according to aspects of the present invention.

At block 201, a semiconductor-on-insulator (SOI) wafer is fabricated by wafer bonding a transfer substrate to a SOI substrate having a buried oxide (BOX).

The transfer substrate may include a heat conducting dielectric formed thereon, while a support substrate may include the BOX. The heat conducting dielectric may be bonded to the BOX with a transfer process to form a complete SOI substrate with the heat conducting dielectric and the box buried between the support substrate and the transfer substrate.

At block 202, a hardmask is patterned on the SOI substrate and fins are etched into the SOI substrate down to the BOX.

The fins may be etched through the material of the transfer substrate and the heat conducting dielectric to form substantial vertical fins including a heat conducting dielectric layer with a fin of transfer substrate material disposed over the heat conducting dielectric layer.

At block 203, a dummy gate is formed between spacers on the SOI substrate transverse to and over the fins.

The dummy gate may be formed by depositing a dummy gate material over the semiconductor device such that the dummy gate material extends in a direction transverse to the fins. As such, the dummy gate material is formed over and around the fins, extending across the semiconductor device.

The spacers can then be formed on each side of the dummy gate. The spacers can be formed by depositing a layer of spacer material conformally over the semiconductor device. The horizontal portions of the spacer material may then be removed by an isotropic etch, such as, e.g., RIE, to leave behind the vertical portions on each side of the dummy gate.

At block 204, source/drain regions are grown over exposed portions of the fins not under the dummy gate and spacers.

Portions of the fins not covered by the dummy gate and spacers remain exposed. These exposed portions may undergo an epitaxial growth process to grow a conductive material from the fins. The conductive material may include any suitable conductive material such as, e.g., a doped semiconductor (for example, Si:P or SiGe:B). The conductive material forms source/drain regions over the fins adjacent to the spacers outside of the dummy gate.

At block 205, the source and drain regions and the SOI substrate are encapsulated by a high thermal conductivity dielectric.

The high thermal conductivity dielectric is deposited as a conformal layer over the semiconductor device to fully encapsulate the components of the semiconductor device, thus forming a heat conducting coating. The heat conducting coating may be formed from a material that is the same as a material of the heat conducting dielectric on the transfer substrate. Such materials may include any high thermal conductivity dielectric, such as, e.g., $Al_2O_3$, $Y_2O_3$ or SiN.

At block 206, a dielectric fill is performed to form an interlevel dielectric (ILD) burying the fins, source/drain regions, and dummy gate.

The dielectric fill may include depositing a dielectric material, such as, e.g., $SiO_2$ over the semiconductor device to bury the fins, source/drain regions, and dummy gate of the semiconductor device in the ILD. A planarization process may then be used to recess the ILD and the heat conducting coating down to a top of the dummy gate to expose the dummy gate material.

At block 207, the dummy gate is replaced with a gate dielectric, gate conductor and gate cap to form a gate between the spacers.

The exposed dummy gate material is recessed and removed from the dummy gate between the spacers. Thus, the fins in a channel region between the spacers and the BOX outside of the channel region and between the spacers are exposed.

A dielectric layer is then conformably deposited between the spacers to form a gate dielectric on inside surfaces of the spacers and over the fins and BOX. A conductive material may then be deposited to fill the area between the spacers, thus forming a gate conductor. This gate conductor may be recessed below tops of the spacers with a selective etch process. The recessed portion may then be filled with an insulating material to form a gate cap over the gate conductor. Thus, a gate is formed to replace the dummy gate between the spacers.

At block 208, contacts are formed through the ILD down to the source and drain regions on each side of the gate.

A via is etched through the ILD down to the source/drain regions using an etch process. The etch process may include a first etching step to etch through the ILD, and a second etching step to etch through the heat conducting coating encapsulating the source/drain regions at a top portion of the source/drain regions. Alternative, a single etch step that selects both the ILD and the heat conducting coating may be employed to etch down to the source/drain regions. Thus the source/drain regions are exposed.

The via is then filled with a conductive material through a suitable deposition process. The conductive material replaced the heat conducting coating on a top portion of the source/drain regions and fills the via in the ILD, thus forming a source/drain contact. The source/drain contact permits connections in order to implement the semiconductor device in, e.g., a computer processor, storage, memory, or other device.

Figure 24:
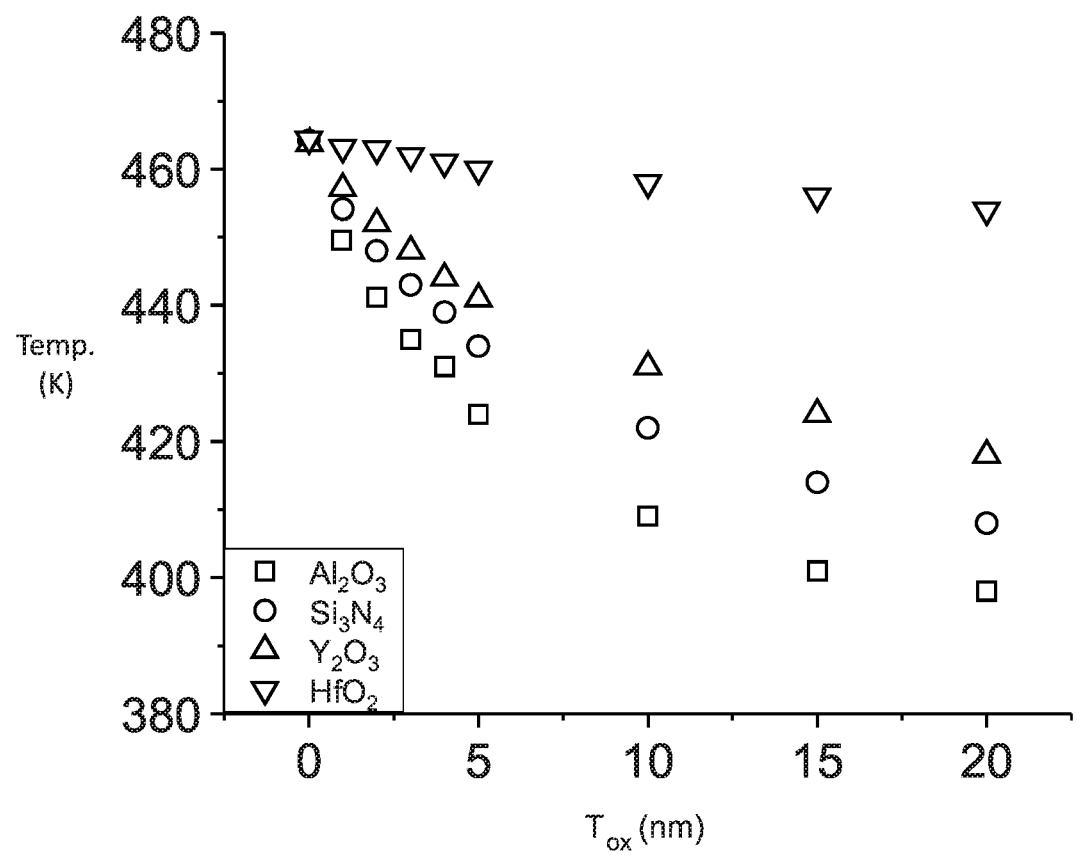
FIG. 24 is a diagram showing thermal behavior in semiconductor devices having different dielectric materials formed therein, in accordance with an embodiment of the present invention.

Referring now to FIG. 24, thermal behavior in semiconductor devices having different dielectric materials formed therein is illustratively depicted according to aspects of the present invention.

A plot depicting simulation findings of various semiconductor devices shows peak temperature in the semiconductor devices as a function of a thickness of the dielectric material beneath a fin and covering the bottom portion of the source/drain regions of the semiconductor devices. As shown, the square markers indicate a dielectric including $Al_2O_3$, circular markers indicate a dielectric including silicon nitride ($Si_3N_4$), right-side up triangular markers indicate a dielectric including $Y_2O_3$, and up-side down markers indicate a dielectric including hafnium oxide ($HfO_2$).

In general, for each material, the greater the thickness of the dielectric, the lower the temperature in the channel region of the semiconductor device, thus reducing the self-heating effects of the device. $HfO_2$ shows the smallest reduction in temperature, while $Al_2O_3$ exhibits the greatest reduction. By comparison, a device with no heat conducting dielectric layer exhibits a temperature at the gate of about 465 Kelvin (K) (approximately 190 C). In fact, a 5 nm thick $Al_2O_3$ layer will reduce the temperature at the gate to about 425 K (approximately 150 C). Thus, $Al_2O_3$ exhibits an approximately 20% reduction in temperature relative to ambient temperature with a 5 nanometer (nm) thickness when compared to no dielectric beneath the fin. However, other scenarios, including other materials, thicknesses and configurations, are contemplated as well.

Accordingly, the heat conducting coating may include one of $Al_2O_3$, $Si_3N_4$, $Y_2O_3$, or $HfO_2$ at a thickness of between, e.g., 0 and 20 nm, and more particular between about 2 and about 15 nm.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
   a substrate, including a buried dielectric layer between a base substrate and semiconductor layer;
   a fin formed in the semiconductor substrate and having source and drain regions formed adjacent to each side of a gate structure; and
   a heat conducting dielectric, having a thermal conductivity of at least 10 Watts per meter-Kelvin (W/m-K), between the buried dielectric layer and fun, source, and drain regions and a heat conducing coating on the sidewalls of a lower portion of the fin and source and drain regions, wherein the fin is in direct contact with the heat conducting dielectric, and the source and drain regions are in direct contact with the heat conducing dielectric and heat conducing coating to transfer heat away from the gate structure.

2. The semiconductor device recited in claim 1, wherein the heat conducting dielectric is selected from the group consisting of aluminum oxide and yttrium oxide.

3. The semiconductor device recited in claim 1, wherein the buried dielectric layer includes a buried silicon oxide disposed between the substrate and the heat conducting dielectric.

4. The semiconductor device recited in claim 1, further including source and drain contacts formed on top portions of the source and drain regions such that the combination of the source and drain contacts, heat conducing coating, and the heat conducting dielectric fully encapsulate the source and drain regions.

5. The semiconductor device recited in claim 1, wherein the heat conducting dielectric is a different heat conducting material from the heat conducting coating.

6. The semiconductor device recited in claim 1, wherein the heat conducting coating further include vertical portions disposed on outside surfaces of the gate structure.

7. The semiconductor device recited in claim 1, wherein the heat conducting dielectric has a thickness in a range between about 2 and about 20 nanometers.

8. The semiconductor device recited in claim 1, wherein the heat conducting dielectric includes a heat conducting dielectric layer formed over the substrate around the fins and outside of the gate structure.

9. The semiconductor device recited in claim 1, wherein the substrate is a semiconductor-on-insulator substrate including the base substrate and a buried oxide in direct contact with the base substrate and the heat conducting dielectric.

10. A semiconductor device comprising:
a semiconductor-on-insulator substrate including a base substrate, a semiconductor layer and a buried dielectric, the buried dielectric being composed of a dielectric layer and a heat conducting dielectric having a thermal conductivity of at least 10 Watts per meter-Kelvin (W/m-K) between the base substrate and the semiconductor layer;
a fin formed directly on the heat conducting dielectric from a semiconductor layer of the semiconductor-on-insulator substrate;
a gate structure formed over and around the fin in a transverse direction relative to the fin, the gate structure including spacers on each sidewall of the gate structure;
source and drain regions epitaxially grown around the fin with a diamond shape adjacent to outer surfaces of the spacers; and
a heat conducting coating, having a thermal conductivity of at least 10 Watts per meter-Kelvin (W/m-K), on the sidewalls of a lower portion of the source and drain regions, wherein the source and drain regions are in direct contact with the heat conducing dielectric and heat conducting to transfer heat away from the gate structure.

11. The semiconductor device recited in claim 10, wherein the heat conducting dielectric is selected from the group consisting of aluminum oxide, yttrium oxide and silicon nitride.

12. The semiconductor device recited in claim 10, further including source and drain contacts formed on top portions of the source and drain regions such that the combination of the source/drain contacts, the heat conducting coating, and the heat conducting dielectric fully encapsulate the source and drain regions.

13. The semiconductor device recited in claim 10, wherein the
heat conducting coating conformally covers the bottom portion of the fin and the source and drain regions.

14. The semiconductor device recited in claim 10, wherein the heat conducting coating further include vertical portions disposed on outside surfaces of the spacers.

15. The semiconductor device recited in claim 10, wherein the heat conducting dielectric has a thickness in a range between about 2 and about 20 nanometers.

16. The semiconductor device recited in claim 10, wherein the heat conducting dielectric includes a heat conducting dielectric layer formed over the substrate around the fins and outside of the gate structure.

* * * * *